United States Patent
Horibe et al.

(10) Patent No.: US 9,306,494 B2
(45) Date of Patent: Apr. 5, 2016

(54) OSCILLATION DEVICE, SCANNING-TYPE SCANNER DEVICE, INFORMATION TERMINAL, PHASE-SHIFT AMOUNT ADJUSTMENT DEVICE, AND PHASE-SHIFT AMOUNT ADJUSTMENT METHOD

(71) Applicant: Funai Electric Co., Ltd., Daito-shi, Osaka (JP)

(72) Inventors: Ryusuke Horibe, Daito (JP); Naoki Inoue, Daito (JP); Manabu Murayama, Daito (JP)

(73) Assignee: Funai Electric Co., Ltd., Osaka (JP)

(*) Notice: Subject to any disclaimer, the term of this patent is extended or adjusted under 35 U.S.C. 154(b) by 92 days.

(21) Appl. No.: 14/274,865

(22) Filed: May 12, 2014

(65) Prior Publication Data

US 2014/0340720 A1 Nov. 20, 2014

(30) Foreign Application Priority Data

May 14, 2013 (JP) ................................. 2013-102264

(51) Int. Cl.

| | | |
|---|---|---|
| G02B 26/08 | (2006.01) | |
| H03B 5/24 | (2006.01) | |
| H04N 1/04 | (2006.01) | |
| H03K 5/01 | (2006.01) | |
| H03K 5/00 | (2006.01) | |

(52) U.S. Cl.
CPC .. *H03B 5/24* (2013.01); *H03K 5/01* (2013.01); *H04N 1/04* (2013.01); *H03K 2005/00286* (2013.01)

(58) Field of Classification Search
CPC ............... G02B 26/08; G02B 26/0816; G02B 26/0833; G02B 26/0841; G02B 26/085; G02B 26/0858; G02B 26/0866; H02P 7/29; B41J 2/47; H03B 5/24; H03K 2005/00286; H03K 5/01; H04N 1/04
USPC ............... 359/198.1–199.4, 200.6–200.8, 359/213.1–215.1, 224.1–224.2, 298; 347/237, 247; 318/119
See application file for complete search history.

(56) References Cited

U.S. PATENT DOCUMENTS

| | | | | |
|---|---|---|---|---|
| 6,956,597 B2 * | 10/2005 | Bush | ........................ | B41J 2/47 347/243 |
| 2005/0274181 A1 | 12/2005 | Kutsuna et al. | | |
| 2008/0111525 A1 | 5/2008 | Fukuzawa | | |
| 2010/0058862 A1 | 3/2010 | Sugibayashi et al. | | |

FOREIGN PATENT DOCUMENTS

| | | |
|---|---|---|
| JP | 2005-351820 A | 12/2005 |
| JP | 2008-124192 A | 5/2008 |
| JP | 2010-066008 A | 3/2010 |

* cited by examiner

*Primary Examiner* — James Phan
(74) *Attorney, Agent, or Firm* — Keating & Bennett, LLP (57) ABSTRACT

An oscillation device includes an oscillator, an oscillation detection unit that detects oscillation of the oscillator and outputs an oscillation detection signal, and a drive unit that generates a drive signal in keeping with the oscillation detection signal and outputs the drive signal to the oscillator. The drive unit includes a phase shift unit that shifts the phase to provide the drive signal as positive feedback to the oscillator. The phase shift unit includes a disturbance generating unit that outputs the periodic signal, a fluctuation unit that causes the amount of phase shift to fluctuate based on the periodic signal, a drive amplitude detection unit that detects the amplitude of the drive signal and outputs a drive amplitude signal, a product detection unit that outputs a detection signal after performing product detection on the drive amplitude signal based on the periodic signal, and an adjustment unit that adjusts the phase-shift amount based on the detection signal.

17 Claims, 12 Drawing Sheets

OSCILLATION DEVICE, SCANNING-TYPE SCANNER DEVICE, INFORMATION TERMINAL, PHASE-SHIFT AMOUNT ADJUSTMENT DEVICE, AND PHASE-SHIFT AMOUNT ADJUSTMENT METHOD

BACKGROUND OF THE INVENTION

1. Field of the Invention

The present invention relates to an oscillation device which causes an oscillator to self-oscillate, a scanning-type scanner device such as a laser projector or laser rangefinder that is equipped with this oscillation device, and an information terminal equipped with this oscillation device. The present invention also relates to a phase-shift amount adjustment device and a phase-shift amount adjustment method which adjust an amount of phase shift in a phase shift unit of this oscillation device.

2. Description of the Related Art

Conventional oscillation devices cause an oscillator to self-oscillate by supplying the oscillator with a drive signal at a frequency that is made to match the mechanical resonance frequency of the oscillator (for examples, see Japanese Patent Application Laid-Open Publication No. 2008-124192, Japanese Patent Application Laid-Open Publication No. 2005-351820, and Japanese Patent Application Laid-Open Publication No. 2010-066008).

The oscillation devices cause the oscillator to self-oscillate by sending a drive signal as positive feedback to the oscillator by making the amount of phase shift in a single complete loop an integer multiple of 0° or 360°. Furthermore, the oscillation devices also automatically control gain such that the amplitude of the oscillator stays constant.

The oscillation devices have the advantage of being able to produce high oscillations in the oscillator at a low drive power because the oscillator is made to resonantly oscillate.

However, variations between individual oscillators, changes in the ambient environment of the oscillation device (such as temperature changes), and the like, cause transfer characteristics to be different from design or desired values, and as a result, the amount of phase shift in a single complete loop ends up deviating from 0°.

Self-oscillation is possible even when the amount of phase shift in a single complete loop deviates somewhat from 0° (±15° or so), but the amplitude of the oscillator cannot be kept constant unless the amplitude of the drive signal is made larger than it is when there is no deviation. Thus, there are problems in that drive power is increased while drive efficiency is worsened. Moreover, if the amount of phase shift in a single complete loop deviates too much from 0°, the additional problem of being unable to initiate self-oscillation also arises.

SUMMARY OF THE INVENTION

Preferred embodiments of the present invention provide an oscillation device with a high drive efficiency, a scanning-type scanner device such as a laser projector or laser rangefinder that is equipped with this oscillation device, and an information terminal equipped with this oscillation device.

In addition, preferred embodiments of the present invention provide a phase-shift amount adjustment device and a phase-shift amount adjustment method with which the drive efficiency of an oscillation device is increased by optimally adjusting an amount of phase shift in a phase shift unit of the oscillation device.

An oscillation device according to a preferred embodiment of the present invention includes an oscillator, an oscillation detection unit which detects oscillation of the oscillator and outputs an oscillation detection signal, and a drive unit which generates a drive signal in keeping with the oscillation detection signal and outputs the drive signal to the oscillator, wherein the oscillation device is configured such that the drive unit includes a phase shift unit which shifts the phase for the purpose of providing the drive signal as positive feedback to the oscillator, and such that the phase shift unit includes a disturbance generating unit that outputs a periodic signal, a fluctuation unit that causes the amount of phase shift to fluctuate based on the periodic signal, a drive amplitude detection unit that detects the amplitude of the drive signal and outputs a drive amplitude signal, a product detection unit that outputs a detection signal after performing product detection on the drive amplitude signal based on the periodic signal, and an adjustment unit that adjusts the phase-shift amount based on the detection signal.

With such a configuration, deviation from integer multiples of 0° or 360° of the phase-shift amount in a complete single loop configured of an oscillator, an oscillation detection unit, and a drive unit are significantly reduced or prevented by adjusting the amount of phase shift, which enables the amplitude of the drive signal to be significantly reduced or minimized, such that drive efficiency is significantly increased.

In the oscillation device described above, it is preferable to have a configuration in which the frequency of the periodic signal is a frequency that is at or below the gain crossover point of the transfer function of a single complete loop configured of the oscillator, the oscillation detection unit, and the drive unit.

With this configuration, changes in the amplitude of the drive signal follow fluctuations in the amount of phase shift based on the periodic signal, so the amount of phase shift is adjusted accurately.

In the oscillation device of the preferred embodiments of the present invention described above, it is preferable that the fluctuation unit determines a second value from a first value according to the polarity and amplitude of the detection signal when the fluctuation unit causes the phase-shift amount to fluctuate using the first value as a reference, which causes the phase-shift amount to fluctuate using the second value as a reference.

This configuration makes it possible for the amount of phase shift to approach close to the optimal value with the second value, so the amount of phase shift is adjusted in a short period of time.

In the oscillation device of any one of the preferred embodiments of the present invention described above, it is preferable that the product detection unit outputs, as the detection signal, a signal that integrates over time the product of the periodic signal and the drive signal or in a configuration in which the product detection unit outputs, as the detection signal, a signal that samples the product of the periodic signal and the drive signal at every half-period of the periodic signal when the periodic signal is at a peak value.

The product detection unit may preferably be configured by using an analog multiplier to multiply the periodic signal and the drive signal. In addition, a stable detection signal can be generated by smoothing with a low-pass filter which has a cutoff frequency that is preferably about one-tenth or less of the periodic signal in order to remove ripple components of the periodic signal that is included in the detection signal. Furthermore, when detection delays due to the low-pass filter create a problem, it is also possible to omit the low-pass filter and to use a method which integrates the detection signal after capturing it only in sectors that are integer multiples of the period of the periodic signal f(t).

In the other configuration described above, the product detection unit preferably generates the detection signal by sampling the drive signal at the positive maximums and negative maximums of the periodic signal and integrating the values sampled at the positive maximum and the polarity inversion of the values sampled at the negative maximum. This method makes digital processing possible with a small number of samples.

A scanning-type scanner device such as a laser projector or laser rangefinder according to a preferred embodiment the present invention includes the oscillation device of any one of the preferred embodiments of the present invention described above and a laser light source, wherein the scanning-type scanner device includes an oscillator that is a microelectromechanical system (MEMS) mirror, and a projected image is generated by reflecting the light that is output from the laser light source using the MEMS mirror.

An information terminal according to another preferred embodiment of the present invention includes a vibrating gyroscope that includes the oscillation device of any one of the preferred embodiments of the present invention described above.

A phase-shift amount adjustment device according to a further preferred embodiment of the present invention is a phase-shift amount adjustment device that adjusts the amount of phase shift in a phase shift unit of an oscillation device that includes an oscillator, an oscillation detection unit that detects the oscillation of the oscillator and outputs an oscillation detection signal, and a drive unit that generates a drive signal in keeping with the oscillation detection signal and outputs it to the oscillator, and in which the drive unit includes the phase shift unit that shifts the phase for the purpose of providing the drive signal as positive feedback to the oscillator, wherein the phase-shift amount adjustment device includes a disturbance generating unit that outputs a periodic signal, a fluctuation unit that causes the amount of phase shift to fluctuate based on the periodic signal, a drive amplitude detection unit that detects the amplitude of the drive signal and outputs a drive amplitude signal, a product detection unit that outputs a detection signal after performing product detection on the drive amplitude signal based on the periodic signal, and an adjustment unit that adjusts the phase-shift amount based on the detection signal.

A phase-shift amount adjustment method according to another preferred embodiment of the present invention is a phase-shift amount adjustment method that adjusts the amount of phase shift in a phase shift unit of an oscillation device that includes an oscillator, an oscillation detection unit that detects the oscillation of the oscillator and outputs an oscillation detection signal, and a drive unit that generates a drive signal in keeping with the oscillation detection signal and outputs it to the oscillator, and in which the drive unit includes the phase shift unit that shifts the phase for the purpose of providing the drive signal as positive feedback to the oscillator, wherein the phase-shift amount adjustment method includes a step of outputting a periodic signal, a step of causing the amount of phase shift to fluctuate based on the periodic signal, a step of detecting the amplitude of the drive signal and outputting a drive amplitude signal, a step of outputting a detection signal after performing product detection on the drive amplitude signal based on the periodic signal, and a step of adjusting the phase-shift amount based on the detection signal.

With various preferred embodiments of the present invention, deviations from integer multiples of 0° or 360° of the phase-shift amount in a complete single loop including an oscillator, an oscillation detection unit, and a drive unit are significantly reduced or prevented by adjusting the amount of phase shift, which enables the amplitude of the drive signal to be significantly reduced or minimized, so the drive efficiency of the oscillation device is significantly increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to drawings. Note that the preferred embodiments described below are shown just as examples, and the present invention is in no way limited to the preferred embodiments described below. Each of the preferred embodiments can be combined as appropriate and carried out as long as there is no contradiction. Furthermore, examples and modifications thereof described in each preferred embodiment can be applied to other preferred embodiments as well as long as there is no contradiction.

First Preferred Embodiment

Figure 1:
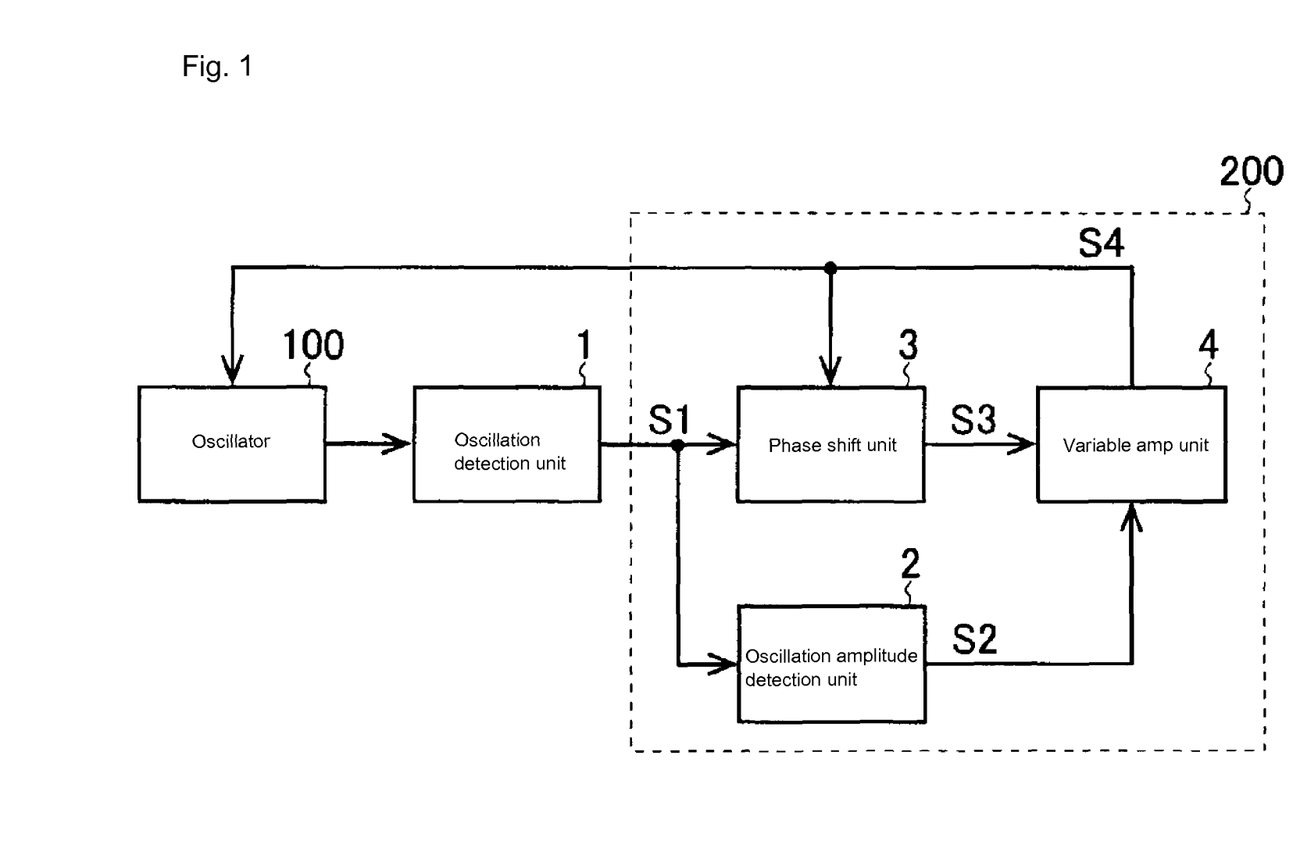
FIG. 1 is a block diagram showing the basic configuration of the oscillation device according to a first preferred embodiment of the present invention.

FIG. 1 is a block diagram showing the basic configuration of the oscillation device according to a first preferred embodiment of the present invention. The oscillation device according to the present preferred embodiment preferably includes an oscillator 100, an oscillation detection unit 1 which detects oscillation of the oscillator 100 and outputs an oscillation detection signal S1, and a drive unit 200 which generates a drive signal S4 in keeping with the oscillation detection signal S1 and outputs the drive signal 4 to the oscillator 100.

One non-limiting example of the configuration of the oscillator 100 is one that includes a piezoelectric element to which a drive signal S4 (constituting a voltage signal) is applied and a vibrator which oscillates accompanying the deformation of this piezoelectric element. Another example is a configuration that includes an electromagnet to which a drive signal S4 (constituting a current signal) is applied and a vibrator which oscillates when the magnetic force of the electromagnet changes.

One non-limiting example of the configuration of the oscillation detection unit 1 is one that is equipped with a capacitance unit whose electrostatic capacitance changes with the oscillation of the vibrator of the oscillator 100 and that outputs the voltage of this capacitance unit as its oscillation detection signal S1, while another possible non-limiting example is a configuration that is equipped with a piezoelectric element on which pressure acts with the oscillation of the vibrator of the oscillator 100 and that outputs the voltage generated within the piezoelectric element as its oscillation detection signal S1.

The drive unit 200 preferably includes an oscillation amplitude detection unit 2, a phase shift unit 3, and a variable amp unit 4. The oscillation amplitude detection unit 2 detects the amplitude of the oscillation detection signal S1 and outputs an oscillation amplitude detection signal S2. The phase shift unit 3 generates a phase shift signal S3 that shifts the phase of the oscillation detection signal S1 by a specified amount of phase shift. The variable amp unit 4 generates a drive signal S4 by supplying a gain in keeping with the oscillation amplitude detection signal S2 to the phase shift signal S3 such that the amplitude of the oscillation detection signal S1 stays constant, and outputs the drive signal S4 to the oscillator 100, thus causing resonant oscillation such that the deflection angle of the oscillator 100 maintains a specified angle. Note that the layout of the phase shift unit 3 and the variable amp unit 4 may be switched.

Figure 2:
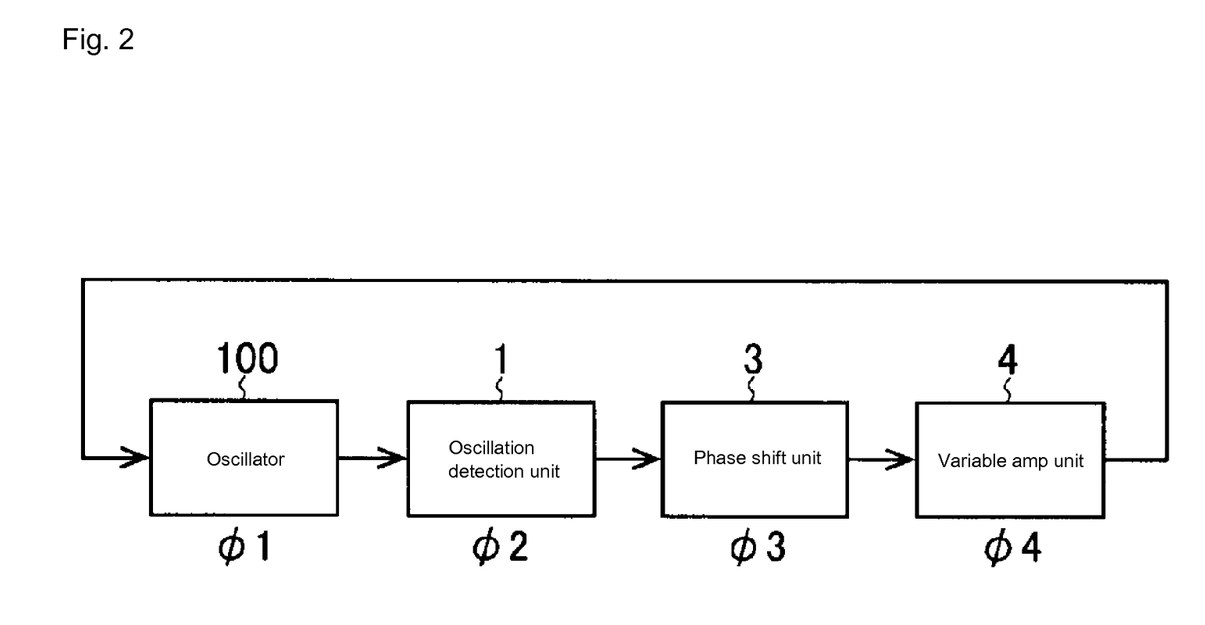
FIG. 2 is a diagram showing the configuration of a single complete loop.

In the oscillation device according to the present preferred embodiment of the configuration, a single complete loop preferably is configured by the oscillator 100, the oscillation detection unit 1, the phase shift unit 3, and the variable amp unit 4 as shown in FIG. 2. The oscillator 100, the oscillation detection unit 1, the phase shift unit 3, and the variable amp unit 4 each have its own transfer function. Here, the phase-shift amount from the transfer function of the oscillator 100 is $\phi 1$, the phase-shift amount from the transfer function of the oscillation detection unit 1 is $\phi 2$, the phase-shift amount from the transfer function of the phase shift unit 3 is $\phi 3$, and the phase-shift amount from the transfer function of the variable amp unit 4 is T4. In order to make the oscillator 100 self-oscillate by providing the drive signal S4 to the oscillator 100 as positive feedback, the specified amount of phase shift in the phase shift unit 3 is set in the present preferred embodiment such that the phase-shift amount in a complete single loop $\phi_{total}$ $(=\phi 1+\phi 2+\phi 3+\phi 4)$ is an integer multiple of 360°, i.e., 0°.

Note that in cases where the specified phase-shift amount in the phase shift unit 3 becomes large with the single complete loop as it is shown in FIG. 2 or in similar cases, it is also possible to add a phase inverter to the single complete loop shown in FIG. 2 (i.e., to add a phase inverter to the oscillation device according to the present preferred embodiment) and to set the specified phase-shift amount in the phase shift unit 3 such that $\phi 1+\phi 2+\phi 3+\phi 4$ is the sum of an integer multiple of 360° and 180°, thus making the phase-shift amount $\phi_{total}$ in a single complete loop an integer multiple of 360°, i.e., 0°. This method is effective when the phase-shift amount of the phase shift unit 3 has become large and the adjustment precision of the phase-shift amount decreases.

However, variations between individual oscillators, changes in the ambient environment of the oscillation device (such as temperature changes), and the like cause the transfer characteristics of the various transfer functions (phase-shift amounts) to be different from design or desired values. As a result, the phase-shift amount for a single complete loop deviates from 0° in some cases.

Figure 3:
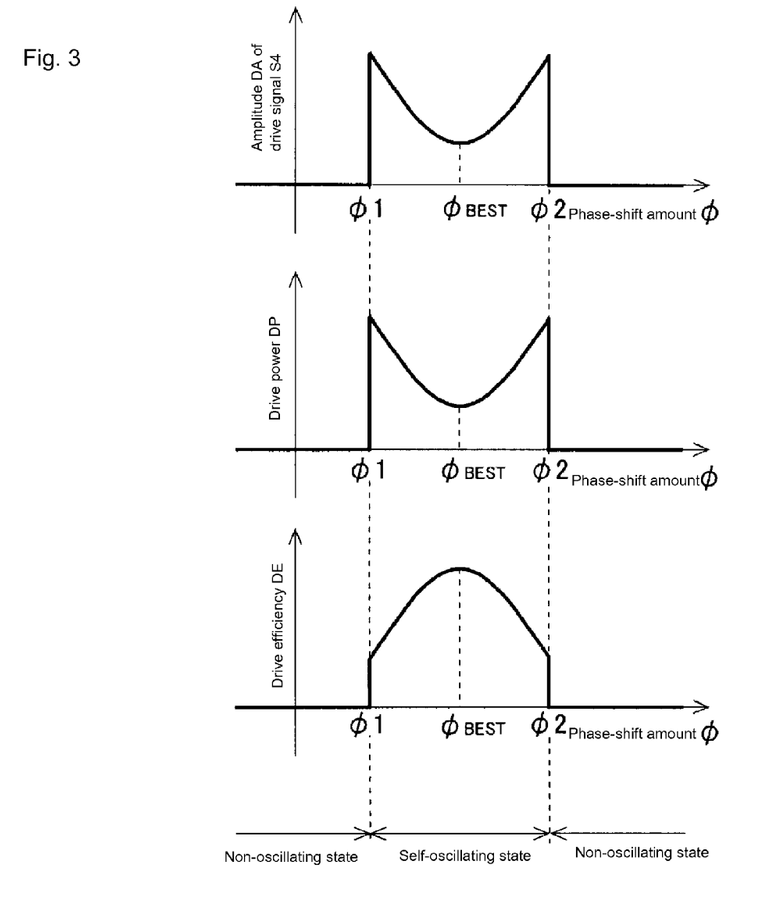
FIG. 3 includes diagrams showing respective relationships between the amount of phase shift and the amplitude, drive power, and drive efficiency of the drive signal.

Self-oscillation is possible even when the amount of phase shift in a single complete loop deviates somewhat from 0° (±15° or so), but the amplitude of the oscillator 100 cannot be kept constant without making the amplitude of the drive signal S4 larger than it is when there is no deviation. Specifically, when the specified phase-shift amount that has been set deviates from the optimal value $\phi_{BEST}$ (the phase-shift amount that results in the phase-shift amount in the single complete loop being 0°), the drive power DP increases, and the drive efficiency DE decreases as shown in FIG. 3. Moreover, when the deviation from the optimal value $\phi_{BEST}$ for the specified phase-shift amount that has been set in the phase shift unit 3 is excessive, the oscillator 100 is placed in a non-oscillating state.

Figure 4:
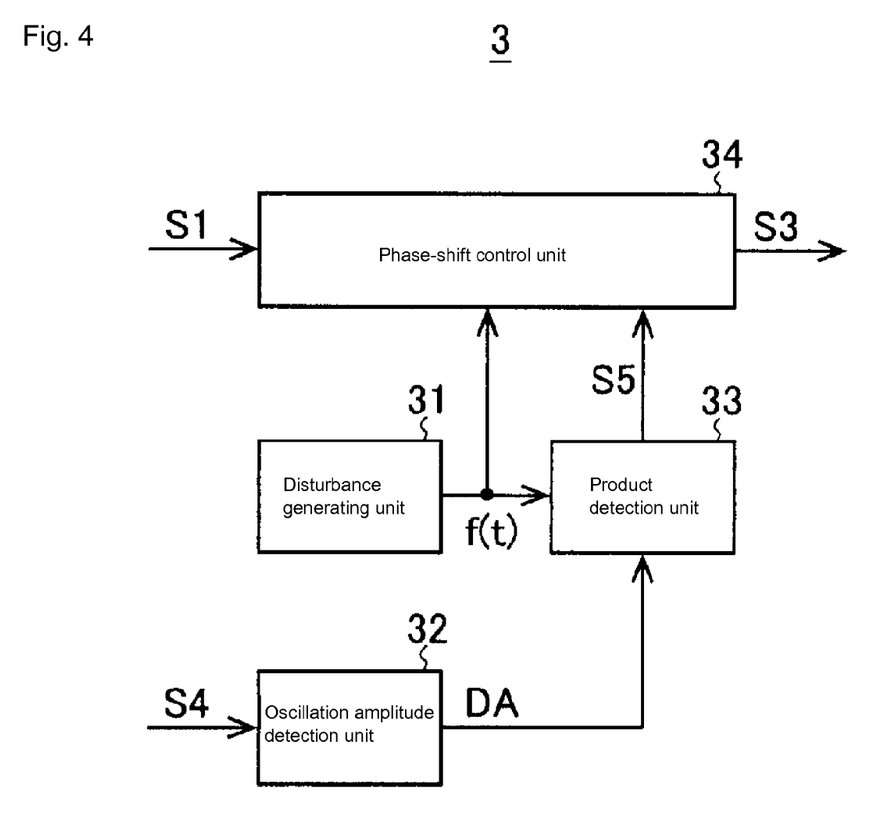
FIG. 4 is a diagram showing the configuration of the phase shift unit according to the first preferred embodiment of the present invention.

In light of this, in the present preferred embodiment, the phase shift unit 3 is configured as shown in FIG. 4, that is, configured so as to include a disturbance generating unit 31, a drive amplitude detection unit 32, a product detection unit 33, and a phase-shift control unit 34, thus making the adjustment of the specified phase-shift amount possible. The disturbance generating unit 31 includes an oscillator and uses the oscillations of the oscillator to output a periodic signal f(t). The drive amplitude detection unit 32 detects the amplitude of the drive signal S4 and outputs a drive amplitude signal DA. The product detection unit 33 outputs a detection signal S5 that runs product detection on the drive amplitude signal DA based on the periodic signal f(t). The phase-shift control unit 34 causes the phase-shift amount to fluctuate periodically based on the periodic signal f(t) and adjusts the phase-shift amount based on the detection signal S5 generated when it fluctuates.

In the present preferred embodiment, the periodic signal f(t) is a sine wave signal. Note that the periodic signal f(t) only needs to be a signal that changes periodically; for example, a triangle wave signal, square wave signal, or the like may also be used. The frequency of the periodic signal f(t) is set to a frequency at or below the gain crossover point of the single complete loop transfer function configured of the oscillator 100, the amplitude detection unit 1, and the drive unit 200 such that the drive amplitude signal DA changes in line with the fluctuations of the phase-shift amount $\phi$.

Figure 5:
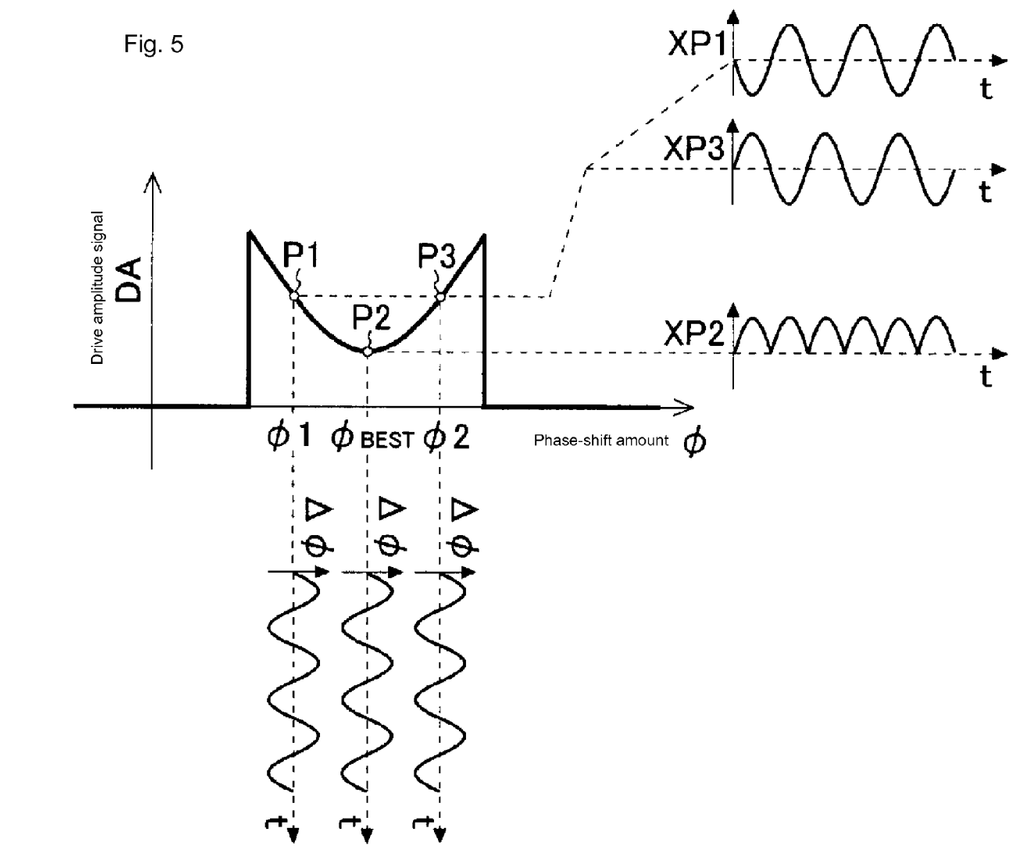
FIG. 5 is a diagram showing the change in the drive amplitude signal when the phase-shift amount is caused to fluctuate.

If the periodic signal is caused to oscillate at the waveform of the signal $\Delta\phi$ whose phase-shift amount $\phi$ is proportional to the periodic signal f(t) based on the phase-shift amount $\phi 1$ at the point P1 shown in FIG. 5, then a change signal XP1 of the drive amplitude signal DA is obtained. The change signal XP1 of the drive amplitude signal DA is an anti-phase signal with the same period as the periodic signal f(t).

If the periodic signal is caused to oscillate at the waveform of the signal $\Delta\phi$ whose phase-shift amount $\phi$ is proportional to the periodic signal f(t) based on the phase-shift amount $\phi_{BEST}$ at the point P2 shown in FIG. 5, then a change signal XP2 of the drive amplitude signal DA is obtained. The period of the change signal XP2 of the drive amplitude signal DA is half the period of the periodic signal f(t).

If the periodic signal is caused to oscillate at the waveform of the signal Δϕ whose phase-shift amount ϕ is proportional to the periodic signal f(t) based on the phase-shift amount ϕ2 at the point P3 shown in FIG. 5, then a change signal XP3 of the drive amplitude signal DA is obtained. The change signal XP3 of the drive amplitude signal DA is an in-phase signal with the same period as the periodic signal f(t).

The phase shift unit 3 uses changes in the drive amplitude signal DA described above to adjust the phase-shift amount. The adjustment of the phase-shift amount performed by the phase shift unit 3 will be described with reference to the flowchart shown in FIG. 6. Note that there are no particular restrictions on the start timing to adjust the phase-shift amount. For example, adjustment of the phase-shift amount may start during the adjustment process prior to factory shipment, adjustment of the phase-shift amount may start periodically by loading a timer functionality into the oscillation device, or it is also possible to provide the oscillation device with an input unit that accepts instructions from the user and to start adjustment of the phase-shift amount according to the instructions from the user.

First, the phase-shift control unit 34 sets the phase-shift amount ϕ that shifts the phase of the oscillation detection signal S1 to a small value that results in a non-oscillating state (see FIG. 3), and then sweeps the phase-shift amount ϕ in the direction in which the phase-shift amount ϕ increases from this set value (step #1).

Figure 6:
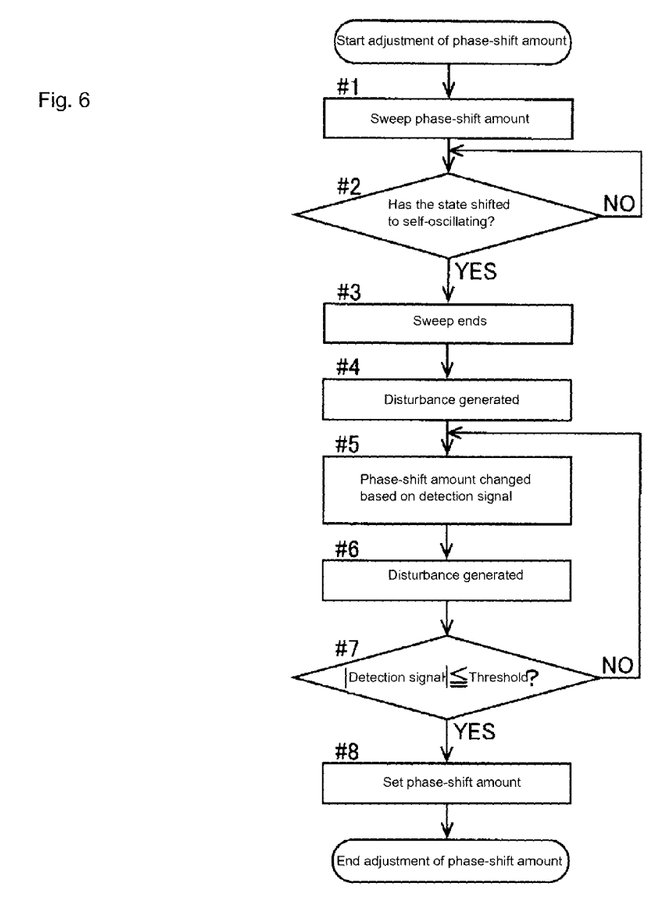
FIG. 6 is a flowchart showing the actions for adjusting the phase-shift amount.

The phase shift unit 3 determines whether the state has shifted from non-oscillating to self-oscillating based on the oscillation detection signal S1 (step #2). Whether or not the state has shifted to oscillating can be determined based on whether or not the oscillation amplitude detection signal S2 is at or above a specified value.

Once the state shifts from non-oscillating to self-oscillating, the sweep of the phase-shift amount ϕ ends after the phase-shift amount ϕ increases by another increment of the specified margin (e.g., 10°) from the shifted point (step #3). This is done in order to prevent the state from returning to the non-oscillating state.

Next, the disturbance generating unit 31 outputs the periodic signal f(t), and the phase-shift control unit 34 causes the phase-shift amount ϕ to oscillate on the waveform of the signal Δϕ in keeping with the periodic signal f(t) (step #4) as shown in FIG. 5. At this time, the product detection unit 33 outputs a detection signal S5 that runs product detection on the drive amplitude signal DA based on the periodic signal f(t).

Figure 7:
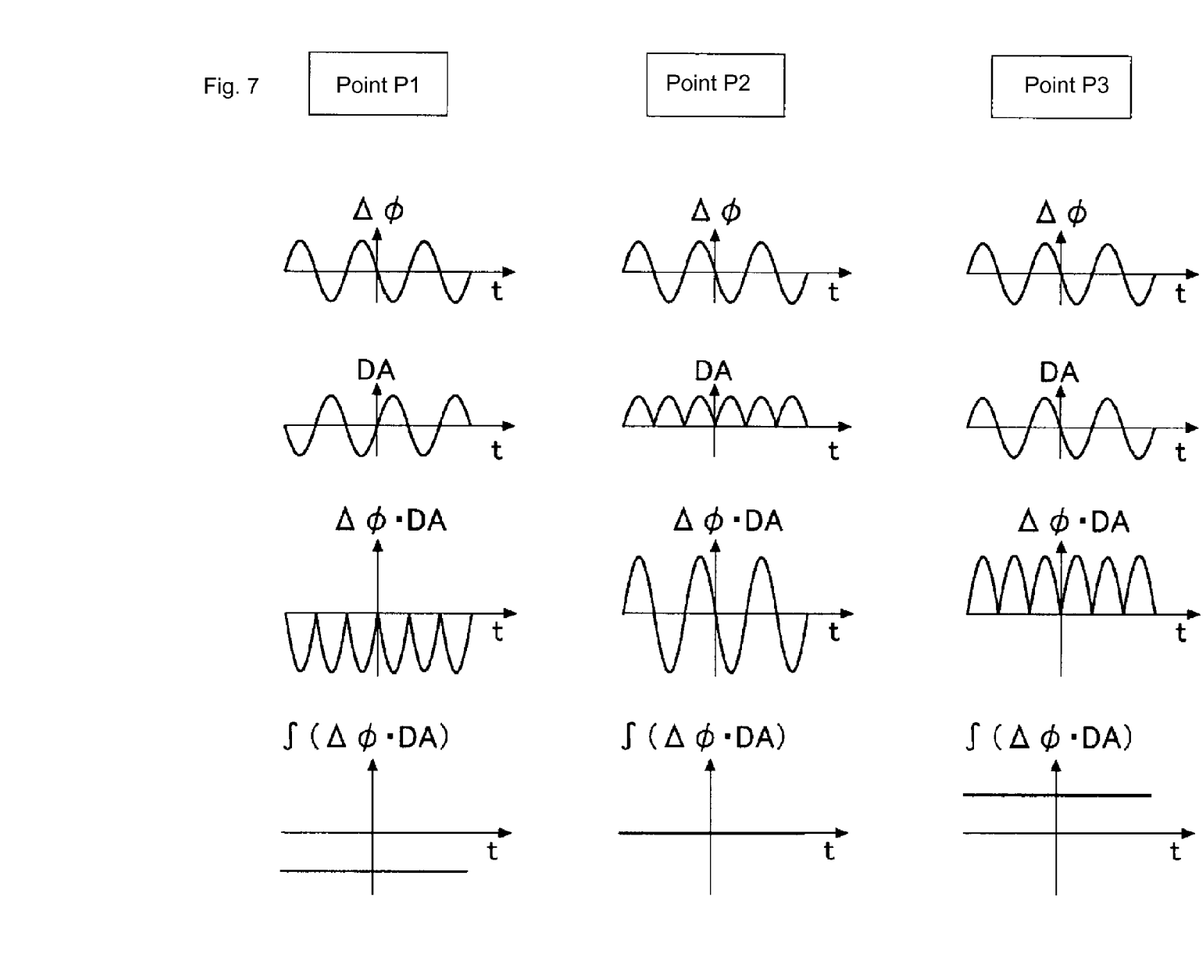
FIG. 7 includes diagrams showing detection signals according to the first preferred embodiment of the present invention.

The product detection unit 33 uses the signal that integrates over time the product of the signal Δϕ made proportional to the periodic signal f(t) and the drive amplitude signal DA as a detection signal S5 (see FIG. 7). When the integration period is set to be sufficiently longer than the period of the periodic signal f(t), it may be integrated by passing the product of the signal Δϕ made proportional to the periodic signal f(t) and the drive amplitude signal DA through a low-pass filter. When this is done, the frequency of the low-pass filter is preferably set to a cutoff frequency of about one-tenth or less of the periodic signal. By doing so, fluctuation of the periodic signal is controlled, thus making it possible to obtain a smoothed, stable detection signal. Meanwhile, when detection delays due to the low-pass filter are a concern, it is also possible to omit the low-pass filter and to use a method that integrates the detection signal S5 after capturing only sectors that are integer multiples of the period of the periodic frequency f(t).

Figure 8:
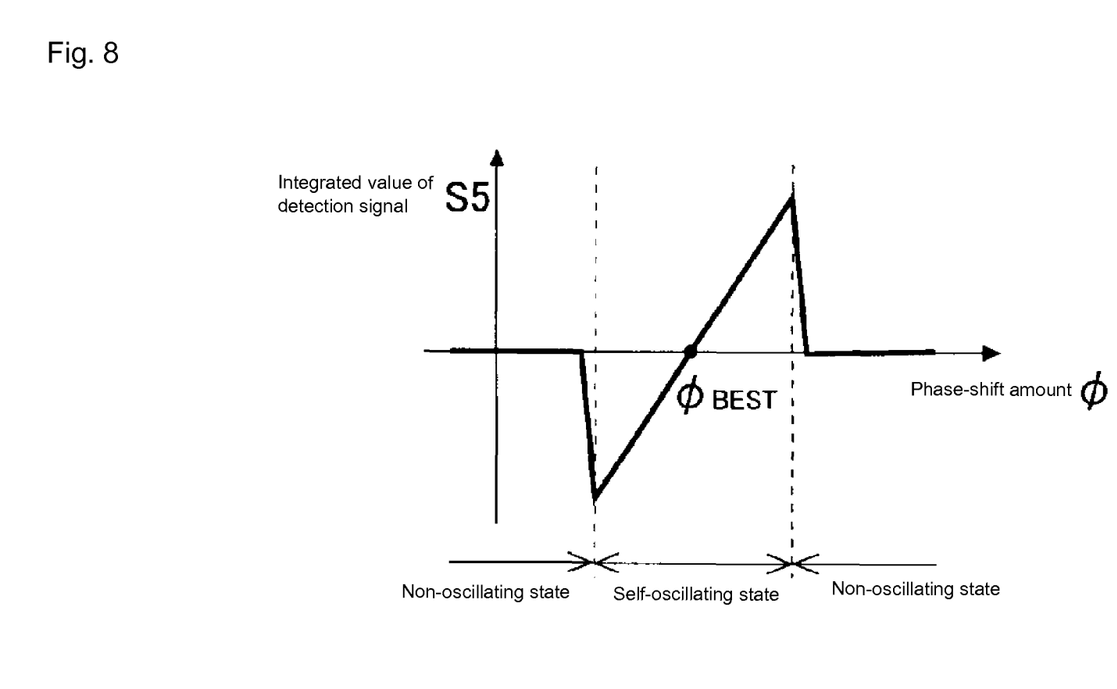
FIG. 8 is a diagram showing the relationship between the phase-shift amount and the detection signal.

The integrated values of the detection signal S5 when the phase-shift amount ϕ is varied are as shown in FIG. 8. When the phase-shift amount ϕ is the optimal value $\phi_{BEST}$ — that is, when the amplitude DA of the drive signal S4 is its minimum, and the drive power DP is its minimum–the integrated value of the detection signal S5 is nearly zero. When the phase-shift amount ϕ is smaller than the optimal value, the integrated value of the detection signal S5 takes a negative value whose absolute value becomes larger according to the deviation from the optimal value (PBEST of the phase-shift amount ϕ. When the phase-shift amount ϕ is larger than the optimal value, the integrated value of the detection signal S5 takes a positive value whose absolute value becomes larger according to the deviation from the optimal value $\phi_{BEST}$ of the phase-shift amount ϕ. Notwithstanding the above, when the deviation of the phase-shift amount ϕ from the optimal value becomes too great, self-oscillation becomes impossible, and oscillation halts.

Next, the phase-shift control unit 34 changes the phase-shift amount ϕ according to the integrated value of the detection signal S5 (step #5). As shown in FIG. 8, the sign of the detection signal S5 indicates the positive or negative direction of the deviation of the phase-shift amount ϕ from the optimal value $\phi_{BEST}$. In addition, the larger that the absolute value of the integrated value of the detection signal S5 is, the larger the deviation of the phase-shift amount ϕ from the optimal value $\phi_{BEST}$ will be. This means that if the product of the integrated value of the detection signal S5 and a specified constant (a negative value in the case of FIG. 9) is added to the current phase-shift amount ϕ and set as the new value, then the phase-shift amount ϕ approaches the optimal value $\phi_{BEST}$. Note that specific numerical values for the constant (negative value) may be determined in advance through experiment, simulation, or other methods, from the slope of the integrated values of the detection signal S5 relative to the phase-shift amount ϕ in the self-oscillation state.

Next, the disturbance generating unit 31 again outputs the periodic signal f(t), and the phase-shift control unit 34 causes the phase-shift amount ϕ to oscillate on the waveform of the signal Δϕ in keeping with the periodic signal f(t) (step #6) as shown in FIG. 5. The phase-shift control unit 34 determines whether the absolute value of the integrated value of the detection signal S5 obtained in this state is at or below a threshold (step #7). The threshold is a numerical value near zero; a specific numerical value may be set in advance, factoring in the integration period when the integrated value of the detection signal S5 is determined, the slope, and the like. The preset threshold may also be made changeable.

If the absolute value of the detection signal S5 is not at or below the threshold, the phase-shift amount ϕ will not be near the optimal value ϕBEST, so the process returns to step #5, and the phase-shift amount ϕ is again updated. On the other hand, if the absolute value of the detection signal S5 is at or below the threshold, the phase-shift amount ϕ will be near the optimal value $\phi_{BEST}$, so the phase-shift amount ϕ at the current point is set as the final phase-shift amount in the phase shift unit 3 (step #8), and the adjustment of the phase-shift amount ends.

The oscillation device according to the present preferred embodiment as described above includes the oscillator 100, the oscillation detection unit 1 that detects the oscillation of the oscillator 100 and outputs the oscillation detection signal S1, and the drive unit 200 that generates the drive signal S4 in keeping with the oscillation detection signal S1 and outputs it to the oscillator 100. Furthermore, the drive unit 200 includes the phase shift unit 3 that shifts the phase for the purpose of providing the drive signal S4 as positive feedback to the oscillator 100. The phase shift unit 3 includes the disturbance generating unit 31 that outputs the periodic signal f(t), the drive amplitude detection unit 32 that detects the amplitude of the drive signal S4 and outputs the drive amplitude signal DA, the product detection unit 33 that outputs the detection signal S5 created by performing product detection on the drive amplitude signal DA based on the periodic signal f(t), and the phase-shift control unit 34 that causes the phase-shift amount to fluctuate based on the periodic signal f(t) and then adjusts the phase-shift amount $\phi$ based on the detection signal S5 generated at the time of this fluctuation.

With this sort of configuration, the deviation from 0° of the phase-shift amount in a complete single loop configured of the oscillator 100, the oscillation detection unit 1, and the drive unit 200 is significantly reduced or prevented by adjusting the amount of phase shift $\phi$, so drive efficiency is significantly increased.

Moreover, by performing product detection on the drive amplitude signal DA using the periodic signal f(t) in the configuration, frequency components other than the frequency of the periodic signal are suppressed, so the deviation from 0° of the phase-shift amount is detected with a high signal-to-noise (S/N) ratio, high precision, and high sensitivity without being affected by external disturbance noise or the like. In addition, the corollary to this is that a tiny amount of fluctuation in the phase-shift amount based on the periodic signal f(t) is set, and the amplitude change in the drive signal S4 at the time of this fluctuation is also suppressed to a very small amount, which in turn means that the phase-shift amount is adjusted even when the oscillation device is being used under normal conditions in a variety of devices.

Furthermore, it is preferable to set the frequency of the periodic signal f(t) at or below the gain crossover point of the single complete loop transfer function configured of the oscillator 100, the amplitude detection unit 1, and the drive unit 200. Moreover, it is preferable that the frequency be set to about one-tenth or less of the gain crossover point.

With such a configuration, changes in the amplitude of the drive signal S4 follow fluctuations in the amount of phase shift $\phi$ based on the periodic signal f(t), so the amount of phase shift $\phi$ is adjusted accurately.

Moreover, the phase-shift control unit 34 determines a second value that is different from the first value according to the polarity and absolute value of the integrated value of the detection signal S5 when the phase-shift control unit 34 causes the phase-shift amount $\phi$ to fluctuate using the first value as a reference as described above, and it causes the phase-shift amount to fluctuate using the second value as a reference, so the phase-shift amount approaches the optimal value very quickly. By doing so, the phase-shift amount is adjusted in a shorter period of time than when using the method of searching for the optimal value by altering the phase-shift amount in steps of small increments of a specified amount.

In addition, the product detection unit 33 outputs a signal that integrates over time the product of the periodic signal f(t) and the drive signal S4 as its detection signal S5. This eliminates a need for sampling like that in the second preferred embodiment to be described below, and extending the integration period, for example, makes it possible to generate a detection signal with the use of an inexpensive circuit such as a low-pass filter.

Second Preferred Embodiment

The oscillation device according to the second preferred embodiment of the present invention preferably is identical to the oscillation device according to the first preferred embodiment of the present invention, except for the method for generating the detection signal S5.

Figure 9:
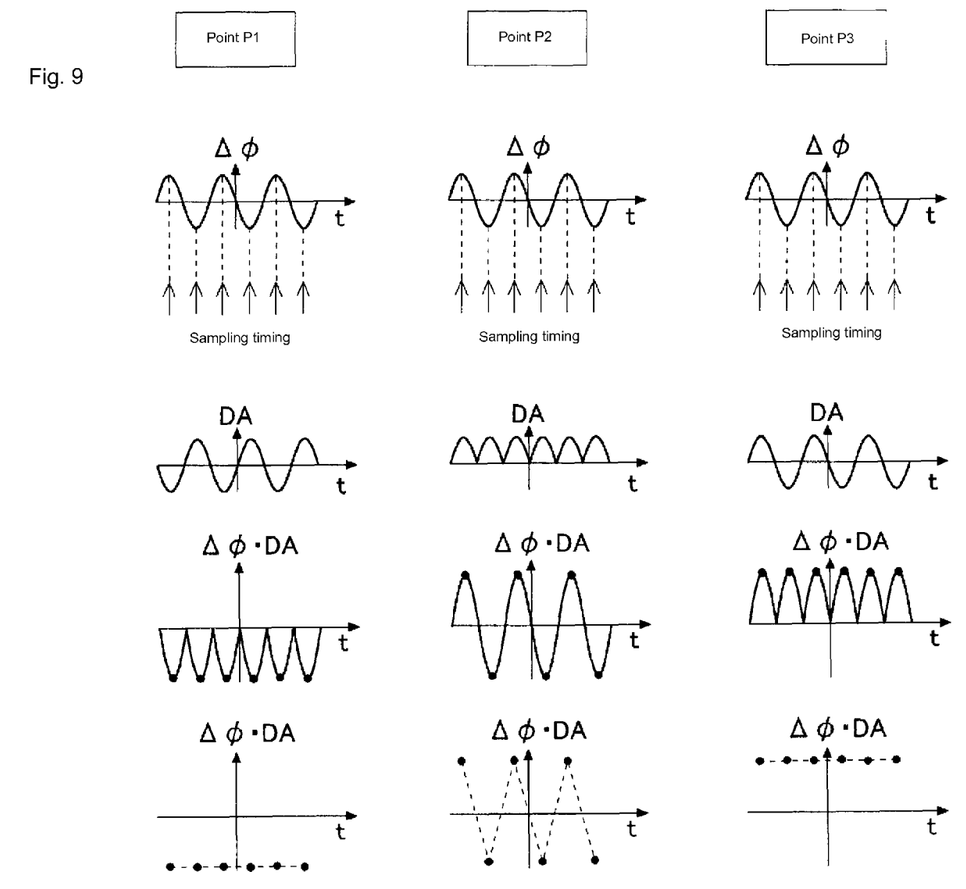
FIG. 9 includes diagrams showing detection signals according to a second preferred embodiment of the present invention.

In the present preferred embodiment, the product detection unit 33 uses as its detection signal S5 a signal that samples the product of the periodic signal f(t) and the drive signal S4 at every half-period of the periodic signal f(t) when the periodic signal f(t) is at a peak value (see FIG. 9). In this case, sampling occurs twice in one period of the periodic signal f(t).

In the present preferred embodiment, the detection signal S5 includes a plurality of discrete outputs, so the value of the detection signal S5 refers to the average value of the discrete output values.

The oscillation device according to the present preferred embodiment as described above exhibits basically the same effects. However, in the present preferred embodiment, the product detection unit 33 uses as its detection signal S5 a signal that samples the product of the periodic signal f(t) and the drive signal S4 at every half-period of the periodic signal f(t) when the periodic signal f(t) is at a peak value. Therefore, unlike the first preferred embodiment, the detection signal S5 is generated by sampling a minimum of one period of sampling values, i.e., sampling at two points, that generate the detection signal S5 by adding the sampling values of n periods of the periodic signal f(t), thus making high-speed detection possible.

Third Preferred Embodiment

The oscillation device according to a third preferred embodiment of the present invention preferably is identical to the oscillation device according to the first preferred embodiment of the present invention, except for the fact that the configuration of the phase shift unit 3 is modified and that the oscillation device is provided with a drive signal output terminal (not shown) which outputs a drive signal S4 to the outside.

Figure 10:
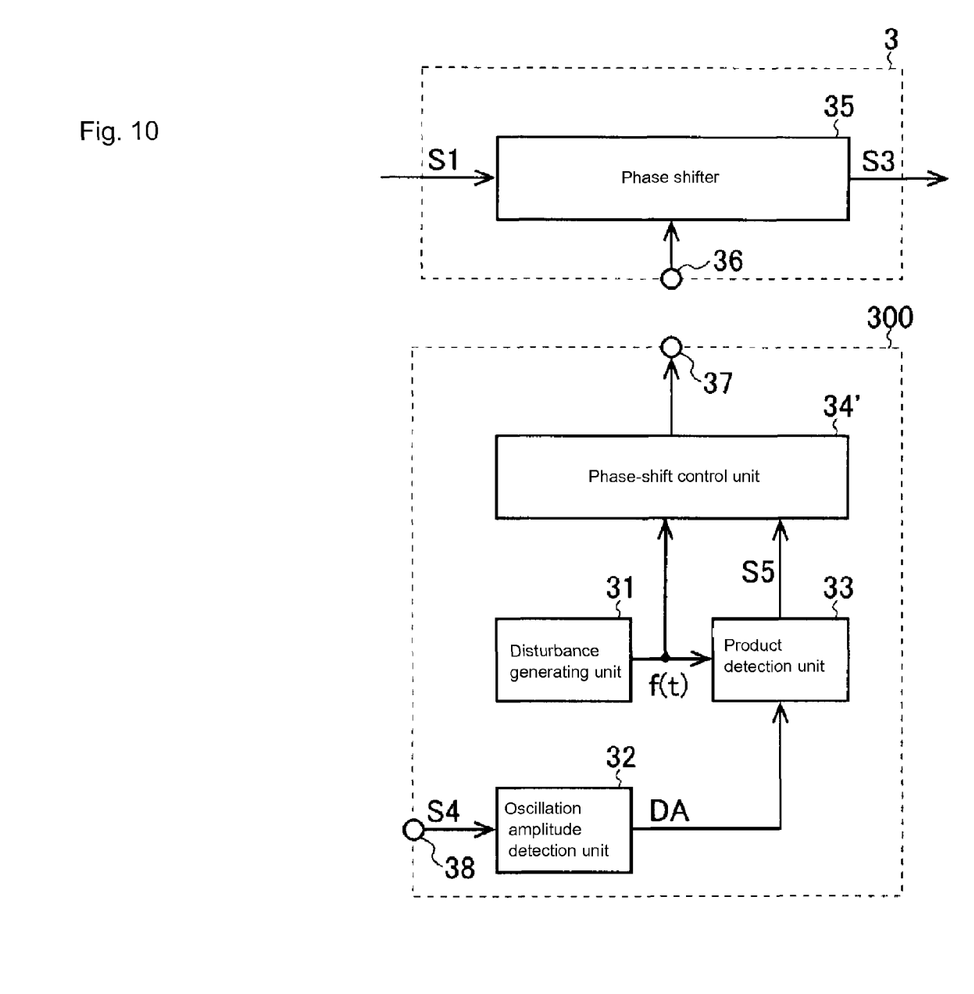
FIG. 10 is a diagram showing the configuration of the phase shift unit according to a third preferred embodiment of the present invention.

In the present preferred embodiment, the phase shift unit 3 includes a phase shifter 35 and a control signal input terminal 36 which takes, as its input, control signals that are sent from outside the oscillation device as shown in FIG. 10. The phase shifter 35 shifts the phase of the oscillation detection signal S1 by a specified phase-shift amount to generate a phase shift signal S3 and then adjusts the specified phase-shift amount according to the control signal that is input to the control signal input terminal 36.

Furthermore, the phase-shift amount adjustment device 300 shown in FIG. 10 includes a disturbance generating unit 31, a drive amplitude detection unit 32, a product detection unit 33, a phase-shift control unit 34', a control signal output terminal 37 which outputs the control signals that are output from the phase-shift control unit 34' to the outside of the phase-shift amount adjustment device 300, and a drive signal input terminal 38 which takes as input the drive signal S4 sent from the drive signal output terminal of the oscillation device. The phase-shift control unit 34' has a configuration in which the functions of the phase shifter 35 in the present preferred embodiment are removed from the phase-shift control unit 34 in the first preferred embodiment. The control signal input terminal 36 and the control signal output terminal 37 may be connected directly or may be connected indirectly via a signal cable or the like. Similarly, the drive signal input terminal 38 and the drive signal output terminal of the oscillation device may be connected directly or may be connected indirectly via a signal cable or the like.

In the present preferred embodiment, the oscillation device and the phase-shift amount adjustment device 300 can be separated at any time except when the phase-shift amount is being adjusted, so a size reduction and a cost reduction of the oscillation device is achieved. The present preferred embodiment is particularly useful in operations in which the phase-shift amount is adjusted only in limited cases such as during the adjustment process prior to factory shipment or during periodic inspections of the machinery in which the oscillation device is loaded.

Fourth Preferred Embodiment

Figure 11:
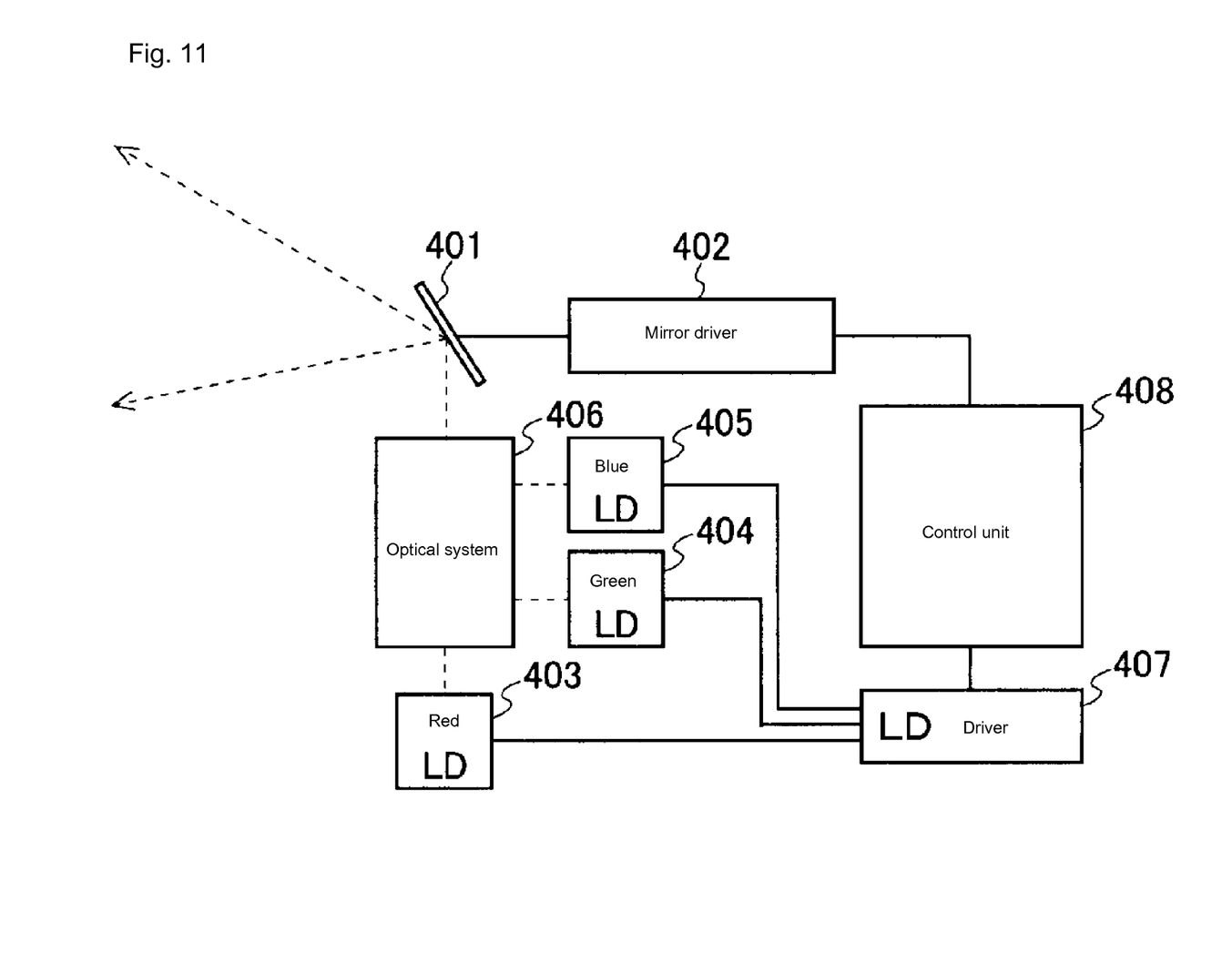
FIG. 11 is a block diagram showing the basic configuration of the laser projector according to a fourth preferred embodiment of the present invention.

FIG. 11 is a block diagram showing the basic configuration of the laser projector according to a fourth preferred embodiment of the present invention. The laser projector according to the present preferred embodiment includes an MEMS mirror 401, a mirror driver 402 which exerts control such that the MEMS mirror 401 oscillates resonantly, a red laser diode (LD) 403, a green LD 404, a blue LD 405, an optical system 406, an LD driver 407 which controls the emission power of the three LDs, and a control unit 408.

The MEMS mirror 401 and the mirror driver 402 that drives the MEMS mirror 401 are configured by the oscillation device according to the first preferred embodiment described above. The set value of the amplitude of the drive signal S4 in the oscillation device is controlled by the control unit 408.

The optical system 406 includes a lens, beam splitter, and the like and guides red laser light that is output from the red LD 403, green laser light that is output from the green LD 404, and blue laser light that is output from the blue LD 405 to the MEMS mirror 401 in such a manner that they pass over the same optical axis.

The LD driver 407 drives the red LD 403, the green LD 404, and the blue LD 405 and controls their respective LD laser power independently in accordance with the control of the control unit 408.

The control unit 408 includes a central processing unit (CPU), memory, and the like and controls the mirror driver 402 and the LD driver 407 according to the image data that will serve as the source of the projected image to be generated.

The laser projector according to the present preferred embodiment configures the MEMS mirror 401 and the mirror driver 402 that drives the MEMS mirror 401 via the oscillation device according to the first preferred embodiment described above, so by optimally adjusting the phase-shift amount ϕ of the oscillation device, drive power is significantly reduced or minimized, and the MEMS mirror 401 is driven efficiently. Note that while a laser projector was given as a non-limiting example in the present preferred embodiment, other devices may also be used so long as they have a MEMS mirror 401 and a mirror driver 402 that exerts control such that the MEMS mirror 401 oscillates resonantly. For example, it can be used in a wide range of scanning-type scanner devices such as laser rangefinders.

Fifth Preferred Embodiment

Figure 12:
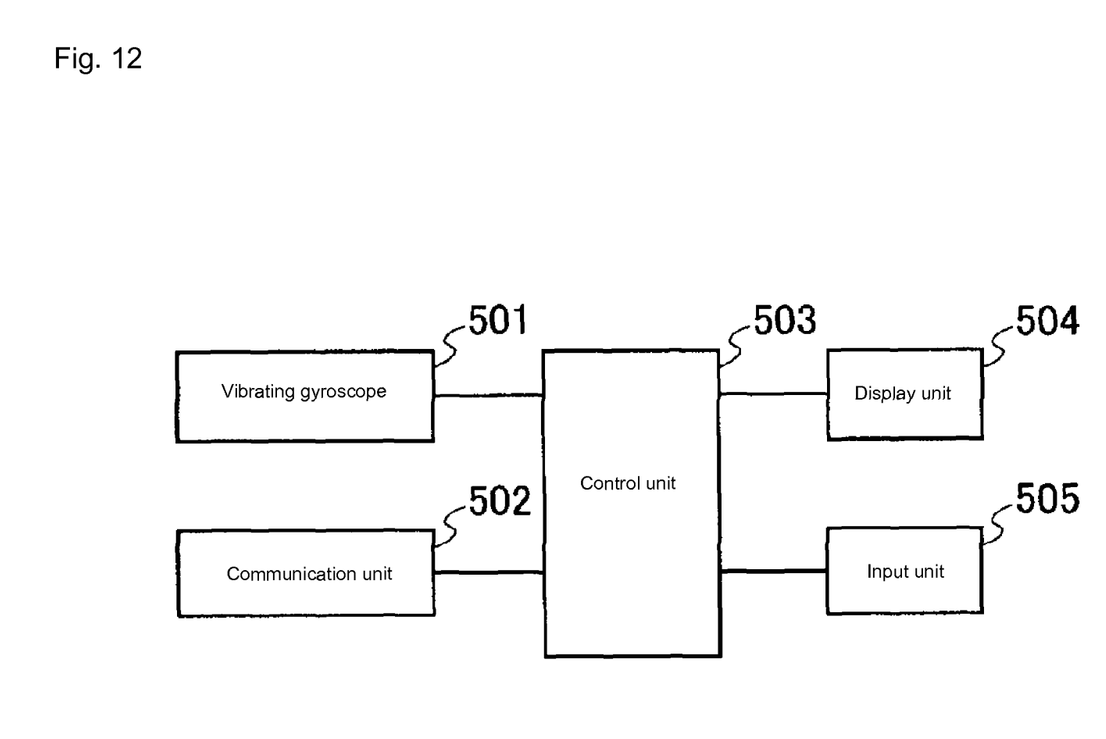
FIG. 12 is a block diagram showing the basic configuration of the information terminal according to a fifth preferred embodiment of the present invention.

FIG. 12 is a block diagram showing the basic configuration of the information terminal according to the fifth preferred embodiment of the present invention. The information terminal according to the present preferred embodiment includes a vibrating gyroscope 501, a communication unit 502, a control unit 503, a display unit 504, and an input unit 505.

The vibrating gyroscope 501 includes an oscillation device according to the first preferred embodiment described above, a Coriolis vibration detection unit, and a gyroscope output unit. The Coriolis vibration detection unit detects Coriolis vibration produced by the vibrator of the oscillator 100 of the oscillation device according to the first preferred embodiment when Coriolis force acts on this vibrator in a state in which the vibrator is oscillating. The gyroscope output unit generates an angular velocity signal by detecting the Coriolis vibration detection signal synchronous with the drive signal S4 and outputs it to the control unit 503.

The communication unit 502 sends and receives various types of data and programming to and from other communications equipment.

The control unit 503 includes a CPU, memory, and the like and controls the overall information terminal. The control unit 503 performs various types of control according to the output of the vibrating gyroscope 501. For instance, it determines whether to display an image on the display unit 504 in landscape or portrait orientation based on the output of the vibrating gyroscope 501. Moreover, when a camera unit is installed in the information terminal, the control unit 503 may also use the output of the vibrating gyroscope 501 to correct for hand shake when photographing with the camera unit.

The display unit 504 displays still and moving images of various types on the display screen. The input unit 505 accepts instructions from the user and sends the contents of these instructions to the control unit 503. The display unit 504 and the input unit 505 may, for example, be integrated as a touch panel liquid crystal display or may individually be separate components. Alternatively, only a portion of the input unit 505 may be integrated with the display unit 504, with the remainder of the input unit 505 being a separate component from the display unit 504 (for example, operating buttons, slide switches, or the like).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An oscillation device comprising:
   an oscillator;
   an oscillation detector that detects oscillation of the oscillator and outputs an oscillation detection signal; and
   a driver that generates a drive signal in accordance with the oscillation detection signal and outputs the drive signal to the oscillator; wherein
   the driver includes a phase shift controller that shifts a phase to provide the drive signal as positive feedback to the oscillator; and
   the phase shift controller includes:
      a disturbance generator that outputs a periodic signal;
      a fluctuator that fluctuates an amount of phase shift based on the periodic signal;
      a drive amplitude detector that detects an amplitude of the drive signal and outputs a drive amplitude signal;
      a product detector that outputs a detection signal after performing product detection on the drive amplitude signal based on the periodic signal; and
      an adjuster that adjusts the phase-shift amount based on the detection signal.

2. The oscillation device according to claim 1, wherein a frequency of the periodic signal is a frequency that is at or below a gain crossover point of a transfer function of a single complete loop including the oscillator, the oscillation detector, and the driver.

3. The oscillation device according to claim 1, wherein the fluctuator determines a second value from a first value according to a polarity and an amplitude of the detection signal when the fluctuator fluctuates the phase-shift amount using the first value as a reference, and fluctuates the phase-shift amount using the second value as a reference.

4. The oscillation device according to claim 1, wherein the product detector outputs, as the detection signal, a signal that integrates over time a product of the periodic signal and the drive signal.

5. The oscillation device according to claim 1, wherein the product detector outputs, as the detection signal, a signal that samples a product of the periodic signal and the drive signal at every half-period of the periodic signal when the periodic signal is at a peak value.

6. A scanner device comprising:
the oscillation device according to claim 1; and
a laser light source; wherein
the oscillator provided is a microelectromechanical system mirror; and
a projected image is generated by reflecting light that is output from the laser light source using the microelectromechanical system mirror.

7. The scanner device according to claim 6, wherein a frequency of the periodic signal is a frequency that is at or below a gain crossover point of a transfer function of a single complete loop including the oscillator, the oscillation detector, and the driver.

8. The scanner device according to claim 6, wherein the fluctuator determines a second value from a first value according to a polarity and an amplitude of the detection signal when the fluctuator fluctuates the phase-shift amount using the first value as a reference, and fluctuates the phase-shift amount using the second value as a reference.

9. The scanner device according to claim 6, wherein the product detector outputs, as the detection signal, a signal that integrates over time a product of the periodic signal and the drive signal.

10. The scanner device according to claim 6, wherein the product detector outputs, as the detection signal, a signal that samples a product of the periodic signal and the drive signal at every half-period of the periodic signal when the periodic signal is at a peak value.

11. An information terminal comprising a vibrating gyroscope that includes the oscillation device according to claim 1.

12. The information terminal according to claim 11, wherein a frequency of the periodic signal is a frequency that is at or below a gain crossover point of a transfer function of a single complete loop including the oscillator, the oscillation detector, and the driver.

13. The information terminal according to claim 11, wherein the fluctuator determines a second value from a first value according to a polarity and an amplitude of the detection signal when the fluctuator fluctuates the phase-shift amount to fluctuate using the first value as a reference, and fluctuates the phase-shift amount using the second value as a reference.

14. The information terminal according to claim 11, wherein the product detector outputs, as the detection signal, a signal that integrates over time a product of the periodic signal and the drive signal.

15. The information terminal according to claim 11, wherein the product detector outputs, as the detection signal, a signal that samples a product of the periodic signal and the drive signal at every half-period of the periodic signal when the periodic signal is at a peak value.

16. A phase-shift amount adjustment device that adjusts an amount of phase shift in a phase shift controller of an oscillation device that includes an oscillator, an oscillation detection detector that detects oscillation of the oscillator and outputs an oscillation detection signal, and a driver that generates a drive signal in accordance with an oscillation detection signal and outputs the drive signal to the oscillator, and in which the driver includes the phase shift controller that shifts a phase to provide the drive signal as positive feedback to the oscillator, the phase-shift amount adjustment device comprising:
a disturbance generator that outputs a periodic signal;
a fluctuator that fluctuates the amount of phase shift based on the periodic signal;
a drive amplitude detector that detects an amplitude of the drive signal and outputs a drive amplitude signal;
a product detector that outputs a detection signal after performing product detection on the drive amplitude signal based on the periodic signal; and
an adjuster that adjusts the phase-shift amount based on the detection signal.

17. A phase-shift amount adjustment method that adjusts an amount of phase shift in a phase shift controller of an oscillation device including an oscillator, an oscillation detector that detects oscillation of the oscillator and to output an oscillation detection signal, and a driver that generates a drive signal in accordance with the oscillation detection signal and outputs the drive signal to the oscillator, and in which the driver includes the phase shift controller that shifts the phase to provide the drive signal as positive feedback to the oscillator, the phase-shift amount adjustment method comprising the steps of:
outputting a periodic signal;
causing the amount of phase shift to fluctuate based on the periodic signal;
detecting an amplitude of the drive signal and outputting a drive amplitude signal;
outputting a detection signal after performing product detection on the drive amplitude signal based on the periodic signal; and
adjusting the phase-shift amount based on the detection signal.

* * * * *